United States Patent [19]
Casasanta et al.

[11] Patent Number: 5,544,203
[45] Date of Patent: Aug. 6, 1996

[54] FINE RESOLUTION DIGITAL DELAY LINE WITH COARSE AND FINE ADJUSTMENT STAGES

[75] Inventors: Joseph A. Casasanta, Allen; Bernhard H. Andresen, Dallas; Yoshinori Satoh, Plano; Stanley C. Keeney; Robert C. Martin, both of Dallas, all of Tex.

[73] Assignee: Texas Instruments Incorporated, Dallas, Tex.

[21] Appl. No.: 324,856

[22] Filed: Oct. 18, 1994

Related U.S. Application Data

[63] Continuation of Ser. No. 18,656, Feb. 17, 1993, abandoned.
[51] Int. Cl.⁶ ........................................ H03D 3/24
[52] U.S. Cl. ........................ 375/376; 370/108; 327/149; 327/150
[58] Field of Search ............................. 370/108, 105.3; 351/1 R, 18, 25; 327/1–3, 141, 144, 146, 147, 149–153, 155, 156, 158, 159; 375/371–376

[56] References Cited

U.S. PATENT DOCUMENTS

| | | | |
|---|---|---|---|
| 4,805,195 | 2/1989 | Keegan | 375/118 |
| 5,077,529 | 12/1991 | Ghoshal et al. | 375/118 |
| 5,079,519 | 1/1992 | Ashby et al. | 375/120 |
| 5,109,394 | 4/1992 | Hjerpe et al. | 375/376 |

*Primary Examiner*—Stephen Chin
*Assistant Examiner*—Hai H. Phan
*Attorney, Agent, or Firm*—Ronald O. Neerings; James C. Kesterson; Richard L. Donaldson

[57] ABSTRACT

A device and method for reducing phase jitter in digital phase locked loop applications resulting in smaller clock skews between application specific integrated circuits (ASICs). Phase jitter is reduced by a fine resolution digital delay line (20) comprising both coarse stages (variable delay element 24) for rough/fast phase adjustment and fine stages (fine resolution delay element 22) for precise delay adjustment when phase lock is near.

32 Claims, 5 Drawing Sheets

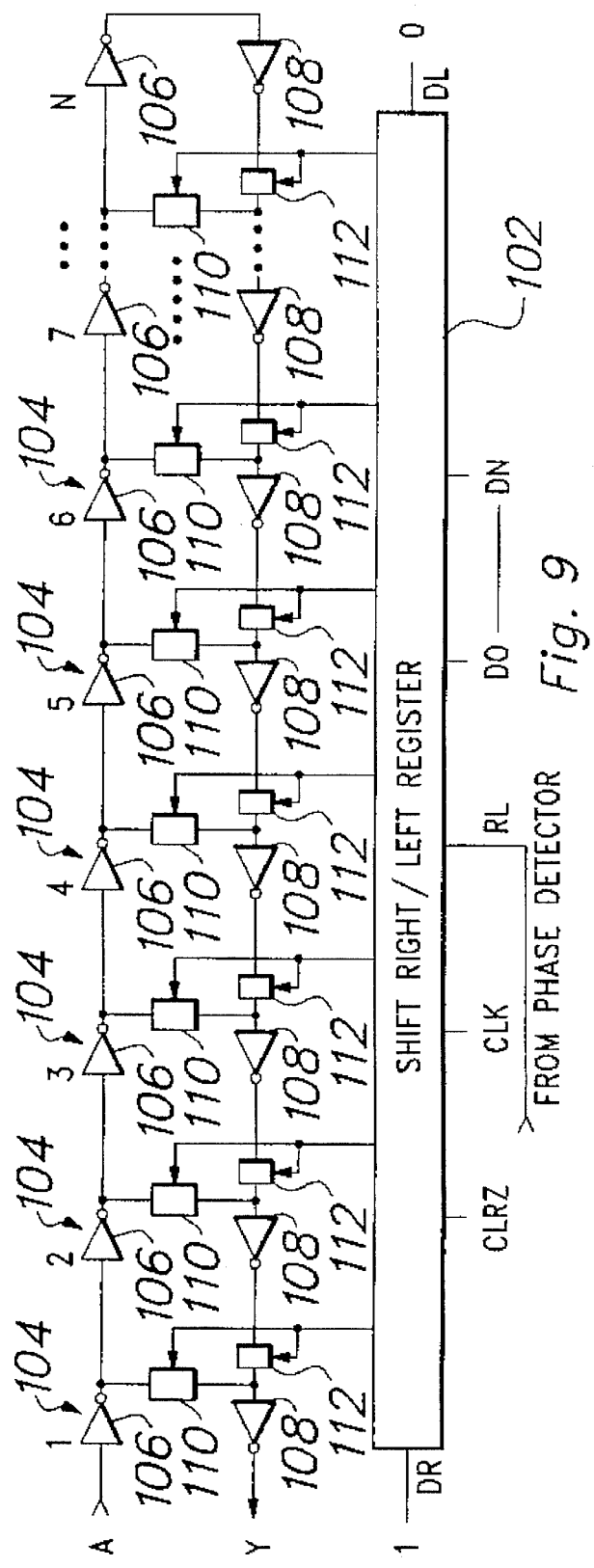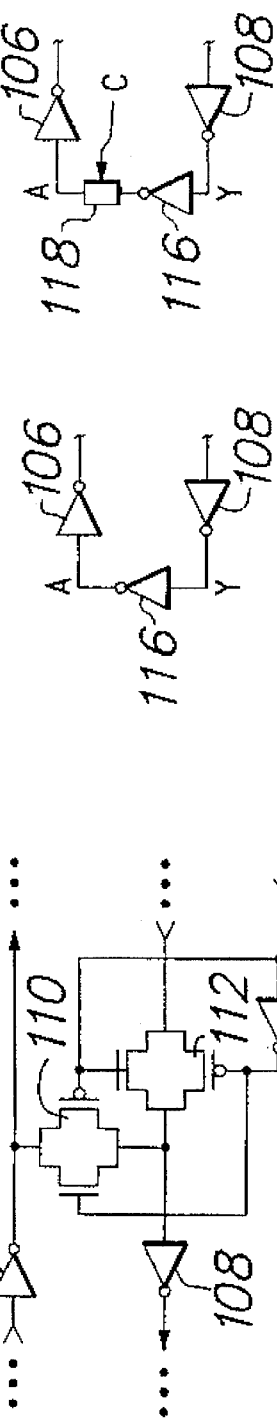
Fig. 9
Fig. 10
Fig. 11
Fig. 12

FINE RESOLUTION DIGITAL DELAY LINE WITH COARSE AND FINE ADJUSTMENT STAGES

This application is a continuation of application Ser. No. 08/018,656 filed Feb. 17, 1993 now abandoned.

FIELD OF THE INVENTION

The present invention relates generally to phase locked loops. More specifically, the present invention relates to a fine resolution digital delay line with coarse and fine adjustment stages in a high performance digital phase locked loop for use in high frequency clock synchronization applications.

BACKGROUND OF THE INVENTION

The most difficult problems in application specific integrated circuit (ASIC) design often involve meeting system I/O timing demands. IC delays can vary by 200–400% over all voltage, temperature, and process conditions. Moreover, clock frequency requirements of electronic systems are continually increasing resulting in increasingly complex clock synchronization requirements. Balancing the timing specifications of the many VLSI parts is a real challenge when delays are so variable. If this delay can be controlled, systems can be designed which more fully exploit the innate performance capabilities of their semiconductor components.

It is important to minimize on-chip clock distribution delay and total system clock skew in a system which uses ASICs in order to provide for safe data transfer between the ASICs. ASIC Phase Locked Loops (PLLs) are used most commonly to eliminate on-chip clock distribution delay. PLLs can eliminate delay in clock buffering by adding an adjustable delay which delays the output signal exactly one clock period relative to the input clock.

By eliminating on chip clock delay, the ASIC's clock to output delay variance and total system clock skew are also dramatically reduced. FIG. 1 shows an example of this. ASIC #1 and ASIC #2 in FIG. 1 both have on-chip PLLs. The system master clock is fed to both ASICs. The clocks are buffered through a PLL which includes a high fan-out clock driver in its feedback loop. This locks the high fan-out internal clock to the phase of the clock coming on-chip. The elimination of the clock tree and I/O delay can nearly double clocking rate between devices which are communicating synchronously to a system master clock.

There are two primary types of PLLs: analog phase locked loops (APLLs); and digital phase locked loops (DPLLs). The basic difference between the two is fairly straightforward. Some analog PLLs use a set delay chain to adjust delay and each element in the delay chain has its delay varied by analog bias voltages supplied by a phase detector. Digital phase locked loops do not adjust delays of any gates, but vary delays by adjusting how many delay steps are included in a delay chain. APLLs thus have continuous delay adjustment whereas DPLLs adjust delays in discrete steps.

The primary advantage of the APLL is that the jitter is very low compared to the step jitter of a DPLL. Although both PLL types can be implemented with mask programmable cells, APLLs require large amounts of SPICE simulation and design time to implement. DPLLs, on the other hand, can be designed with digital simulation only and provide large benefits in system performance while maintaining fast time to market. DPLLs also require no off-chip components and exhibit good immunity to noise. DPLLs can also be used to generate carefully controlled delay lines. These delay lines are often useful in designing memory interfaces, generating new clocks or resolving other difficult system timing problems. DPLLs can also be used as dynamic on-chip performance monitors.

Phase jitter is the most notable performance characteristic of a DPLL. It has a direct impact on the minimum achievable phase error one can expect in a phase locked system. Hence, it is advantageous to make the phase jitter as small as possible. In DPLL applications, the phase jitter is equal to the step size of the digital delay line. Thus, by making the step size of the digital delay line smaller, the effective phase jitter can be reduced resulting in more accurate phase locking capability.

Texas Instruments' TGB1000/TEB 1000 and TGC1000/TEC1000 arrays both offer variable delay line macros in their macro libraries. In each of the macros, the step size is designed to be as small as possible with available library macros. This step size is equal to the delay through a buffer and a transmission gate. The buffer is constructed with two inverters in series. This gives the smallest delay step (step size) achievable with library macros. As system frequencies increase, however, the size of this delay step becomes large relative to the system clock period. Thus, the resulting phase jitter in a locked system becomes a larger source of phase error. Therefore, it is necessary to design a new method of producing smaller delay steps to reduce the impact of phase jitter on clock skew for higher frequency ASIC applications.

SUMMARY OF THE INVENTION

A device and method for reducing phase jitter in digital phase locked loop applications resulting in smaller clock skews between application specific integrated circuits (ASICs). Phase jitter is reduced by a fine resolution digital delay line comprising both coarse stages for rough/fast phase adjustment and fine stages for precise delay adjustment when phase lock is near.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 9 is a circuit diagram of one embodiment of Variable Delay Element 24 of FIG. 3.

FIG. 10 is a circuit diagram of an individual delay unit of Variable Delay Element 24 of FIG. 9.

FIGS. 11 and 12 illustrate how the Variable Delay Element of FIG. 9 can be configured as a ring oscillator.

DETAILED DESCRIPTION OF THE INVENTION

Figure 1:
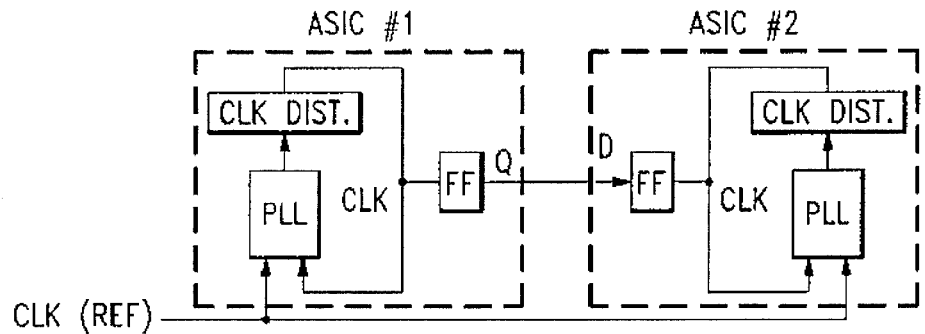
FIG. 1 is a block diagram of two ASIC circuits having on-chip phase locked loops.
Figure 2:
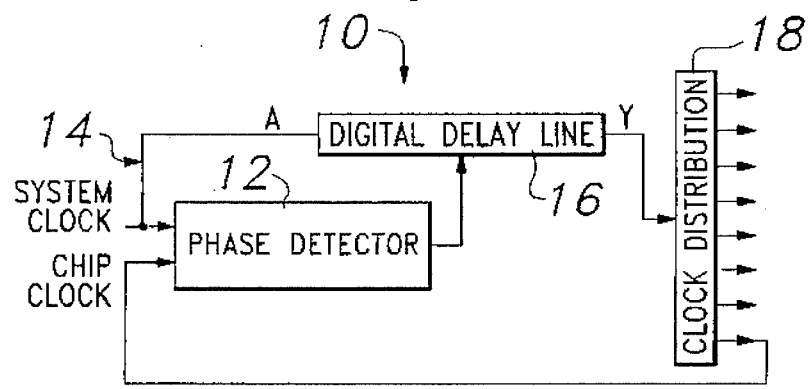
FIG. 2 is a block diagram of a digital PLL circuit.

FIG. 2 illustrates a PLL circuit 10 which synchronizes a system clock signal with a chip clock signal of an individual integrated circuit. An electronic system typically includes a plurality of integrated circuits, each of which has a similar PLL circuit so that all of the respective chip clocks can be synchronized with the system clock. The system clock is input to a phase detector 12 and a delay path 14. The delay path 14 includes a digital delay line 16 comprising a Variable Delay Element having coarse stages for rough/fast phase adjustments (not shown) and other delaying elements such as a high fanout clock distribution circuit 18. The clock distribution circuit 18 distributes the chip clock throughout the integrated circuit, and also feeds back the chip clock as an input to the phase detector 12. Because the system clock is obtained at the input of delay path 14, the chip clock is time-shifted relative to the system clock due to the delay of the delay path 14.

The phase detector 12 detects the phase relationship between the system clock and the chip clock, and includes a control circuit which produces control signals based on the detected phase relationship. The signals from the control circuit are then applied to the digital delay line 16, which is responsive to the control signals to adjust the amount of delay in the delay path 14.

Phase jitter is the most notable performance characteristic in a DPLL. It has a direct impact on the minimum achievable phase error one can expect in a phase locked system. Hence it is advantageous to make the phase jitter as small as possible. In DPLL applications, phase jitter is equal to the step size of the digital delay line. Thus, by making the step size of the digital delay line smaller, the effective phase jitter can be reduced resulting in more accurate phase locking capability. But, as system frequencies increase, the size of this delay step becomes large relative to the system clock period. Thus, the resulting phase jitter in a locked system becomes a larger source of phase error.

While not presently possible to directly reduce the step size of the variable delay element, it is feasible to indirectly create this effect. This is accomplished with the addition of a fine resolution delay element. Its function is to reduce the step size by a factor of two when used in conjunction with the variable delay element. The result is half the phase jitter as compared with a circuit having the variable delay element alone.

Figure 3:
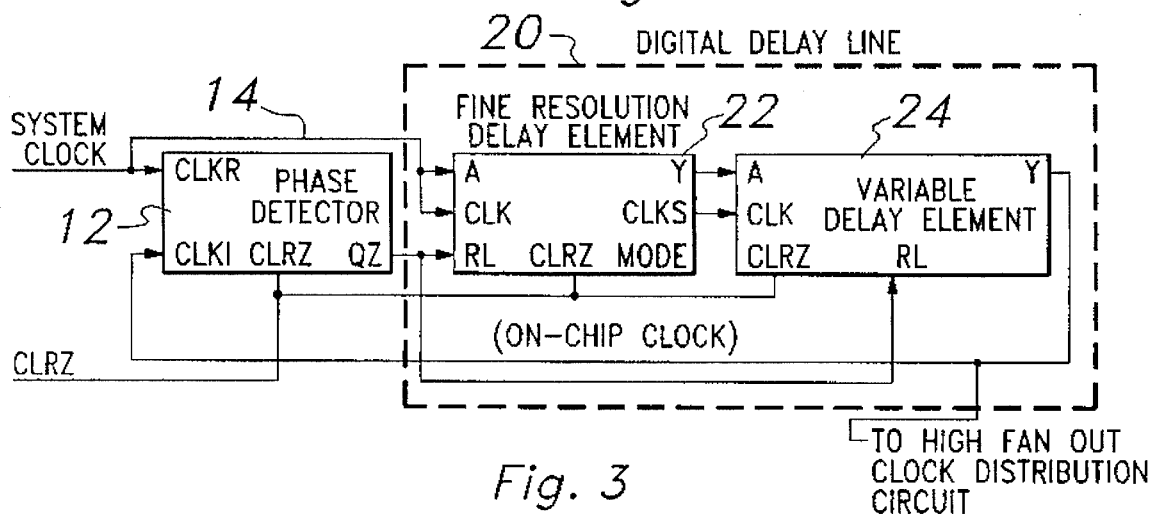
FIG. 3 is a block diagram of a digital PLL circuit according to a preferred embodiment of the invention.

FIG. 3 shows a fine resolution DPLL according to a preferred embodiment of the invention. The circuit includes a phase detector 12, and a Digital Delay Line 20 comprising a fine resolution delay element 22 and a variable delay element 24. As can be seen, the Y output of the Fine Resolution Delay Element is serially connected to the A input of the Variable Delay Element to form a delay line from A input (Fine Resolution Delay Element) to Y output (Variable Delay Element). The Y output of Variable Delay Element 24 is also connected to a high fan out clock distribution network (not shown). The DPLL can be initialized by use of the CLRZ input. This causes both the MODE and CLKS outputs of the Fine Resolution Delay Element to be taken low. Thus upon initialization, there is an offset delay in the DPLL equal to two delay steps that can be attributed to the minimum delay in the Fine Resolution Delay Element in addition to the minimum delay in the Variable Delay Element each of which is equal to one delay step.

Figure 4:
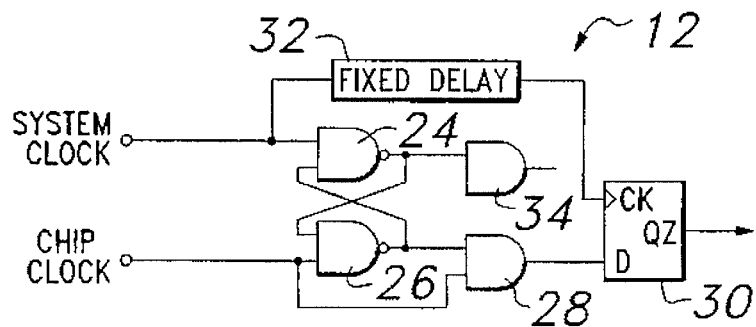
FIG. 4 is a circuit diagram of one embodiment of the phase detector of FIG. 3.

The control circuit of Phase Detector 12 is illustrated in detail in FIG. 4. More specifically, the phase detector 12 includes a pair of cross-coupled NAND gates 24 and 26, the NAND gate 24 having the system clock input thereto and the NAND gate 26 having the chip clock (signal from output Y of the Variable Delay Element or other elements in the feedback loop) input thereto. The output of NAND gate 26 is input to AND gate 28, which AND gate 28 has the chip clock as its other input. The output of the AND gate 28 is connected to the data input of a D flip-flop 30. The system clock is connected to the clock input of the flip-flop 30 via a fixed delay element 32.

More specifically, the fixed delay element 32 has an input connected to the system clock input of NAND gate 24 and an output connected to the clock input of the flip-flop 30. The fixed delay element 32 provides a fixed amount of propagation delay between the input and output thereof, thus providing a delay between the system clock and the clock input of the flip-flop 30. Of course, the propagation delay of element 32 is not absolutely fixed because it does vary with process, voltage and temperature. However, the delay is fixed relative to the other propagation delays and setup times of the phase detector 12. An AND gate 34 has an input connected to the output of NAND gate 24 in order to provide load balancing. The QZ output of flip-flop 30 is connected to the right/left (RL) shift control inputs of Fine Resolution Delay Element 22 and bidirectional shift register 102 of Variable Delay Element 24.

Figure 5:
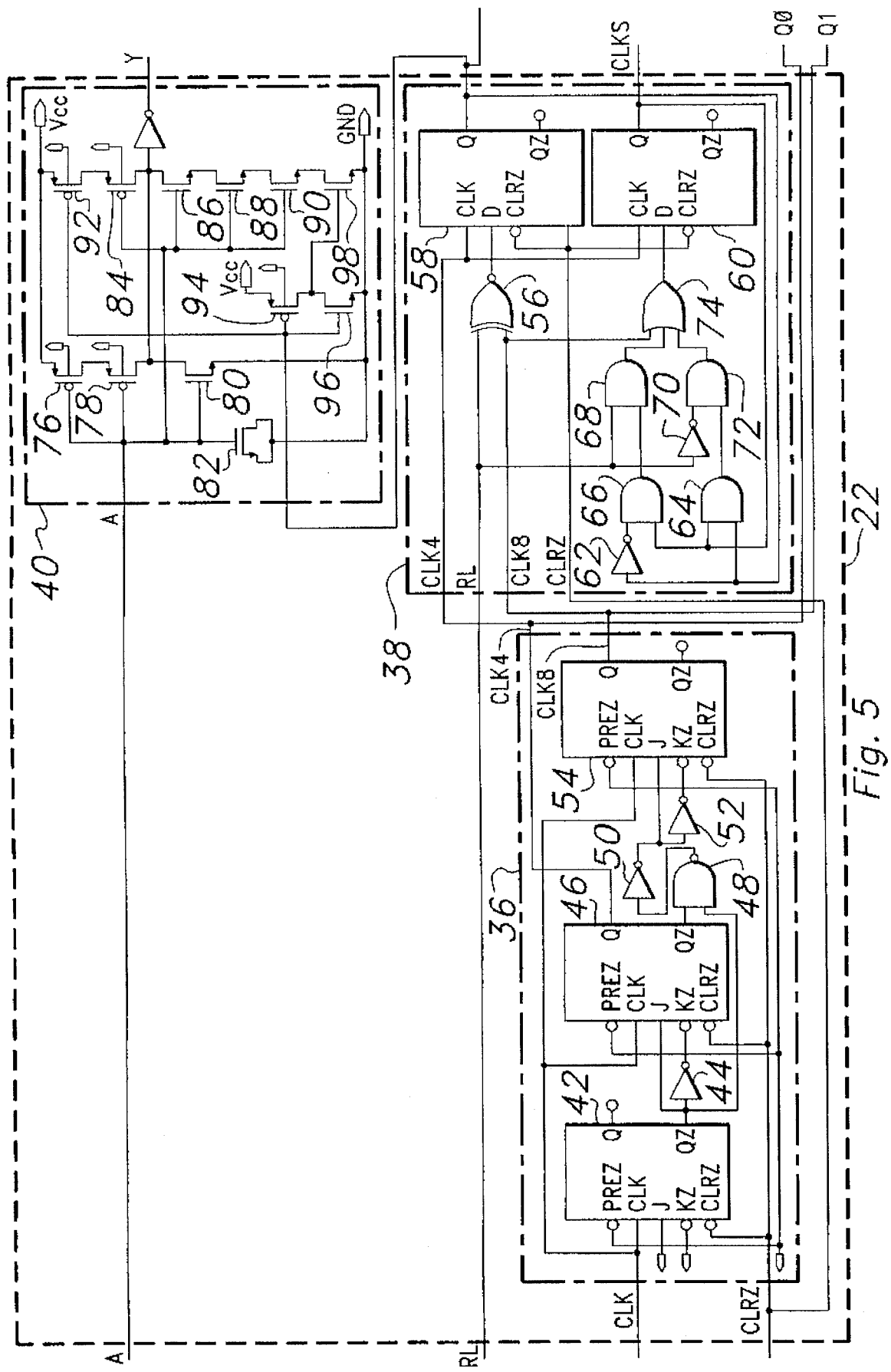
FIG. 5 is a circuit diagram of one embodiment of Fine Resolution Delay Element 22 of FIG. 3.

FIG. 5 is a circuit diagram of one embodiment of Fine Resolution Delay Element 22 of FIG. 3. Fine Resolution Delay Element 22 includes a data input A, a right/left control input RL, a positive edge triggered clock input CLK, an active low asynchronous clear input CLRZ, a data output Y, a step control output MODE, a step control output CLKS, Q0 output, a divide by 4 of CLK input and Q1 output, a divide by 8 of CLK input. Fine Resolution Delay Element 22 also comprises a synchronous divide by 8 circuit 36, a halfstep switching logic circuit 38 and an element circuit 40. Inputs A and CLK of Fine Resolution Delay Element 22 are connected to the system clock. Input RL is connected to output QZ of Phase Detector 12 and to the RL input of Variable Delay Element 24. Input CLRZ is connected to active low asynchronous clear CLRZ and to the CLRZ inputs of Phase Detector 12 and Variable Delay Element 24. Output Y is connected to input A of Variable Delay Element 24. Output CLKS is connected to input CLK of Variable Delay Element 24.

Figure 6:
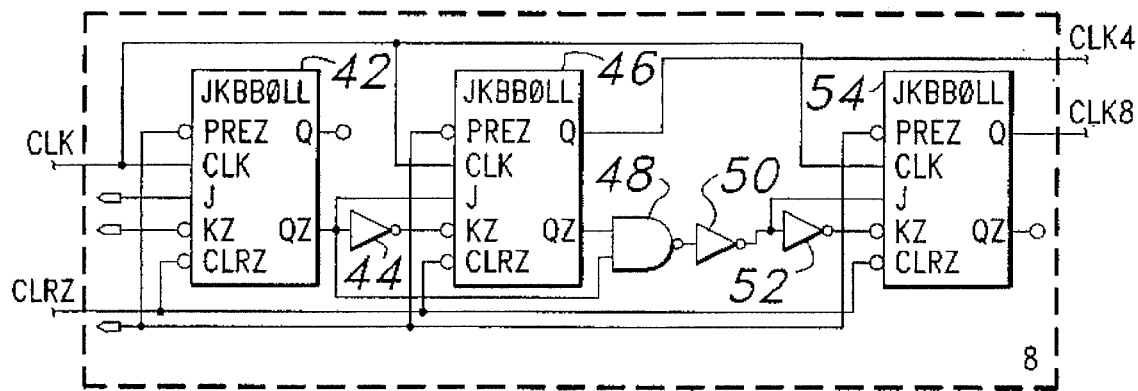
FIG. 6 is an enlarged circuit diagram of synchronous divide by 8 circuit 36 of Fine Resolution Delay Element 22 of FIG. 5.

FIG. 6 is an enlarged view of synchronous divide by 8 circuit 36 of Fine Resolution Delay Element 22. Synchronous divide by 8 circuit 36 includes a first flip-flop 42, a first inverter 44, a second flip-flop 46, a NAND gate 48, a second inverter 50, a third inverter 52 and a third flip-flop 54. The CLK inputs of the first, second and third flip-flops are connected to the CLK input of Fine Resolution Delay Element 22. Inputs CLRZ of the first, second and third flip-flops are connected to the CLRZ input of Fine Resolution Delay Element 22. Output QZ of the first flip-flop is connected to input J of second flip-flop 46, to an input of first inverter 44 and to an input of NAND gate 48. The output of first inverter 44 is connected to input KZ of second flip-flop 46. Output Q of second flip-flop 46 is connected to output CLK 4 of synchronous divide by 8 circuit 36. Output QZ of second inverter 50 is connected to a second input of NAND gate 48.

The output of NAND gate 48 is connected to the input of second inverter 50. An output of second inverter 50 is connected to input J of third flip-flop 54 and to the input of third inverter 52. The output of third inverter 52 is connected to input KZ of third flip-flop 54. Output Q of the third flip-flop is connected to CLK8 output of synchronous divide by 8 circuit 36.

Figure 7:
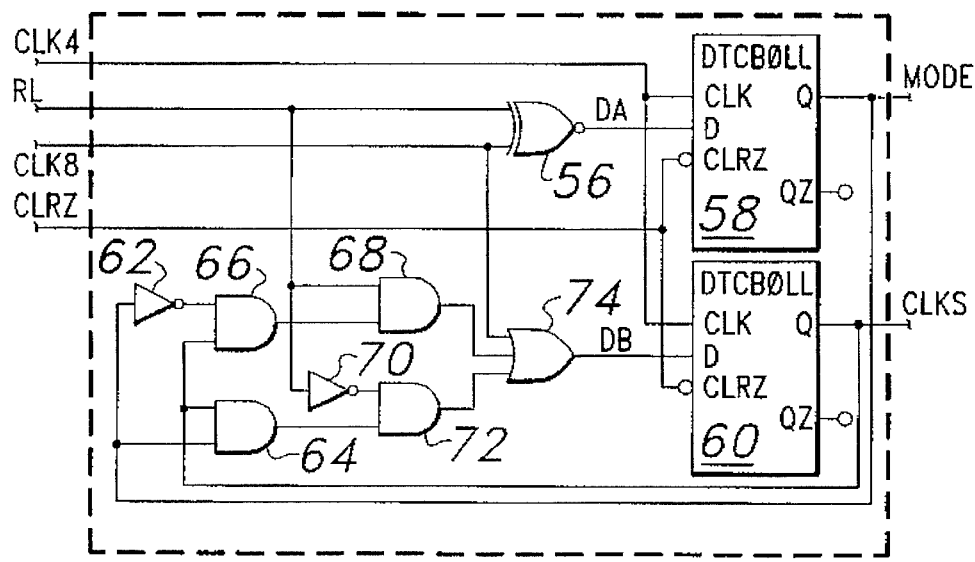
FIG. 7 is an enlarged circuit diagram of halfstep switching logic circuit 38 of Fine Resolution Delay Element 22 of FIG. 5.

FIG. 7 is an enlarged view of halfstep switching logic circuit 38. Halfstep switching logic circuit 38 comprises two inverters, four AND gates, one OR gate, one exclusive NOR gate and two flip-flops. A first input of exclusive NOR gate 56 is connected to input RL of halfstep switching logic circuit 38 which is also connected to right/left control input RL of Fine Resolution Delay Element 22. A second input of exclusive NOR gate 56 is connected to CLK8 output of synchronous divide by 8 circuit 38. The output of exclusive NOR gate 56 is connected to input D of first flip-flop 58. CLK inputs of first and second flip-flops 58 and 60 are connected to CLK4 output of synchronous divide by 8 circuit 36. CLRZ inputs of the first and second flip-flops are connected to the active low asynchronous clear input CLRZ of Fine Resolution Delay Element 22.

The output Q of first flip-flop 58 is connected to a MODE output of halfstep switching logic circuit 38, to the step control output MODE of Fine Resolution Delay Element 22, to the input of first inverter 62 and to a first input of first AND gate 64. The output Q of second flip-flop 60 is connected to output CLKS of halfstep switching logic circuit 38, to the step control output CLKS of Fine Resolution Delay Element 22, to a second input of first AND gate 64 and to a first input of second AND gate 66. The output of inverter 62 is connected to a second input of second AND gate 66. The output of second AND gate 66 is connected to a first input of third AND gate 68. A second input of third AND gate 68 and the input of second inverter 70 are connected to input RL of halfstep switching logic circuit 38 which is also connected to right/left control input RL of Fine Resolution Delay Element 22. The output of second inverter 70 is connected to a first input of fourth AND gate 72. The output of AND gate 64 is connected to the second input of fourth AND gate 72.

A first input of OR gate 74 is connected to input CLK8 of halfstep switching logic circuit 38 which is also connected to CLK8 output of synchronous divide by 8 circuit 36. The output of third AND gate 68 is connected to a second input of OR gate 74. The output of fourth AND gate 72 is connected to a third input of OR gate 74. The output of OR gate 74 is connected to input D of second flip-flop 60. The CLRZ inputs of the first and second flip-flops are connected to input CLRZ of halfstep switching logic circuit 38 which is also connected to the active low asynchronous clear input CLRZ of Fine Resolution Delay Element 22.

Figure 8:
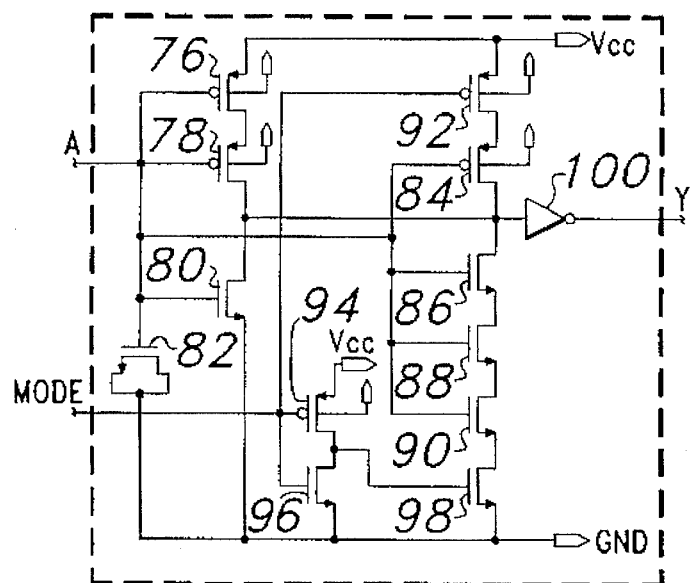
FIG. 8 is an enlarged circuit diagram of element circuit 40 of Fine Resolution Element 22 of FIG. 5.

FIG. 8 is an enlarged view of element circuit 40. Element circuit 40 comprises seven N-channel transistors, five p-channel transistors and an inverter. Input A of element circuit 40 is connected to data input A of Fine Resolution Delay Element 22, to the gates of first p-channel transistor 76, second p-channel transistor 78, first n-channel transistor 80, second n-channel transistor 82, third p-channel transistor 84, third n-channel transistor 86, fourth n-channel transistor 88 and fifth n-channel transistor 90.

The gates of fourth p-channel transistor 92, fifth p-channel transistor 94, sixth n-channel transistor 96 are connected to input MODE of element circuit 40 which is connected to MODE output of halfstep switching logic 38, and step control output MODE of Fine Resolution Delay Element 22. The sources of first p-channel transistor 76 and fourth p-channel transistor 92 are connected to VCC. The drain of first p-channel transistor 76 is connected to the source of second p-channel transistor 78. The drain of second p-channel transistor 78 is connected to the drain of first n-channel transistor 80. The drain and source of second n-channel transistor 82 are connected to the source of first n-channel transistor 80, sixth n-channel transistor 96, seventh n-channel transistor 98 and to ground GND.

The drain of fourth p-channel 92 is connected to the source of third p-channel transistor 84. The drain of third p-channel transistor 84 is connected to the input of inverter 100 and to the drains of second p-channel transistor 78, first n-channel transistor 80, and to the drain of third n-channel transistor 86. The source of third n-channel transistor 86 is connected to the drain of fourth transistor 88. The source of fourth n-channel transistor 88 is connected to the drain of fifth n-channel transistor 90. The source of fifth n-channel transistor 90 is connected to the drain of seventh n-channel transistor 98. The gate of seventh n-channel transistor 98 is connected to the drain of fifth p-channel transistor 94 and sixth n-channel transistor 96. The output of inverter 100 is connected to output Y of element circuit 40 and to data output Y of Fine Resolution Delay Element 22.

Data output Y of Fine Resolution Delay Element 22 is connected to data input A of Variable Delay Element 24. Step control output CLKS of Fine Resolution Delay Element 22 is connected to positive edge triggered clock input CLK of Variable Delay Element 24. Active low asynchronous clear CLRZ of Variable Delay Element 24 is connected to the CLRZ inputs of Phase Detector 12 and Fine Resolution Delay Element 22. Right/left control input RL of Variable Delay Element 24 is connected to the QZ output of Phase Detector 12 and to input RL of Fine Resolution Delay Element 22.

FIG. 9 discloses a circuit diagram of one embodiment of Variable Delay Element 24. Variable Delay Element 24 includes a bidirectional shift register 102 and a plurality of individual delay units 104 which are cooperable to define a plurality of delay path sections for selective insertion into delay path 14 to adjust the total delay amount provided by delay path 14. As shown in FIGS. 9 and 10, each delay unit 104 includes a pair of inverters 106 and 108 which function as delay elements, and a pair of pass gates 110 and 112 which function as switching elements. Each inverter 106 and 108 provides a propagation delay between the input and output thereof, and each pass gate 110 and 112 functions as a switching element which is switchable into open and closed positions. The pass gate 110 is arranged between inverters 106 and 108 for permitting selective connection of the output of inverter 106 to the input of inverter 108, and the pass gate 112 is connected to the input of inverter 108 for permitting selective connection thereof to the next adjacent delay unit 104.

Referring to FIGS. 2 and 9, and particularly to the leftmost stage 1 delay unit 104 in FIG. 9, the input of stage 1 inverter 106 also defines the input A of Variable Delay Element 24 and the output of stage 1 inverter 108 also defines the output Y of Variable Delay Element 24. The remaining delay units 104 are arranged in a chain-like configuration as shown in FIG. 9. The individual stages of the chain-like configuration are connected as shown in FIG. 9. The output of stage 1 inverter 106 is connected to the input of stage 2 inverter 106, and the output of stage 2 inverter 108 is connected to the stage 1 pass gate 112 so as to be selectively connectable to the input of stage 1 inverter 108. Each of the remaining stages is connected to the immediately preceding stage in the same manner that stage 2 is connected to stage 1.

The bidirectional shift register 102 functions as a delay adjustment circuit responsive to the phase detector for operating the pass gates 110 and 112 as switching elements to selectively insert the various possible delay path sections into the delay path 14. For example, by enabling stage 1 pass gate 110 and disabling all pass gates 112, a delay section defined by stage 1 inverter 106, stage 1 pass gate 110 and stage 1 inverter 108 is inserted into the delay path. As another example, by disabling stage 1 pass gate 110, enabling stage 1 pass gate 112, enabling stage 2 pass gate 110 and disabling the remaining pass gates 112, a delay section defined by stage 1 inverter 106, stage 2 inverter 106, stage 2 pass gate 110, stage 2 inverter 108, stage 1 pass gate 112 and stage 1 inverter 108 is inserted into delay path 14.

Referencing FIG. 10, the pass gates 110 and 112 of each delay unit 104 are enabled or disabled by a single register cell or bit 114 of the shift register 102. When the bit in register cell 114 is a 0, then pass gate 110 is enabled and pass gate 112 is disabled. When the bit in register cell 114 is a 1, then pass gate 110 is disabled and pass gate 112 is enabled. Thus, considering the pair of pass gates 110 and 112 associated with each individual delay unit 104, one pass gate is enabled and the other is disabled depending on whether the bit in register cell 114 is a 1 or 0. It should also be noted that the pass gates 110 and 112 of each individual delay unit 104 will be enabled/disabled substantially simultaneously with one another because both pass gates 110 and 112 are controlled by a single bit of the shift register 102.

Referring again to FIG. 9, the data to be shifted rightwardly in shift register 102 is provided at the DR input, and the data to be shifted leftwardly is provided at the DL input. As shown in FIG. 9, the DR input is tied to a logic 1, and the DL input is tied to a logic 0. At system power up, all of the cells 114 of register 102 are cleared, so that all of the pass gates 110 are enabled and all of the pass gates 112 are disabled. Therefore, at power up, the delay section defined by stage 1 inverter 106, stage 1 pass gate 110 and stage 1 inverter 108 is in the delay path 14. However, if logic 1's are thereafter shifted rightwardly through shift register 102, then pass gates 110 are sequentially disabled while the pass gates 112 are sequentially enabled. Thus, if three 1's are shifted rightwardly into shift register 102 after power-up, then the following delay section will be inserted into delay path 14: Inverters 106 of stages 1–4, and pass gates 112 of stages 1–3 and inverters 108 of stages 1–4 and stage 4 pass gate 110. The selected delay section can be identified by simply reading the contents of shift register 102 by any conventional means.

It should be evident that the delay provided by variable delay element 24 is increased by shifting additional logical 1's rightwardly through shift register 102 and is decreased by shifting logical 0's leftwardly through shift register 102. The smallest possible delay section which can be inserted into delay path 14 is the section defined by stage 1 inverter 106, stage 1 pass gate 110 and stage 1 inverter 108. This minimum delay occurs when the shift register contains all 0's, such as at power up. With each additional 1 that is shifted rightwardly, an additional incremental delay amount is added into the delay path 14. The incremental delay amount is the sum of the propagation delays of two inverters and one pass gate, except for the Nth stage which adds the delay of two inverters only. For total uniformity, a "dummy" gate delay could be inserted between stage N inverters 106 and 108. The maximum possible delay occurs when the shift register contains all 1's and the maximum possible delay is defined by the number N of stages in the Variable Delay Element 24. The number N of stages can be as large as necessary to realize the required maximum delay.

Thus, Variable Delay Element 24 provides a wide range of delay adjustment, which helps compensate for wide variations in system components caused by changes in process, voltage and temperature. The wide range of delay adjustment also allows two chips to communicate with one another safely because large discrepancies resulting from both gate complexity/fanout and variations in temperature, process and voltage between the two chips can be absorbed. It should also be noted that the aforementioned minimum delay provided by the Variable Delay Element is the same no matter how many stages are used in the chain. Thus, the only design criteria is that enough delay units 104 must be included to ensure adequate delay even under minimum delay conditions of process, voltage and temperature. It is therefore possible to construct the Variable Delay Element such that the maximum delay thereof under minimum delay conditions of process, voltage and temperature is significantly larger than the minimum delay thereof under maximum delay conditions of process, voltage and temperature. In other words, it is easy to design the Variable Delay Element to operate both at high frequencies and over a relatively wide range of frequencies compared to prior art delay lines.

The Variable Delay Element described above can be configured as a ring oscillator by inserting an inverter 116 between output Y and input A, as shown in FIG. 11. If a pass gate 118 is inserted between inverter 116 and input A as shown in FIG. 12, then the resulting structure can be selectively configured as a ring oscillator or a delay line by respectively enabling or disabling the pass gate 118 via the control line C. Thus, the single circuit structure of FIG. 12 provides the user with two design options.

The embodiment of Variable Delay Element 24 shown in FIG. 9 contains 25 conditional path delays (A to Y). Each of these 25 fixed delay stages represent 1 delay step. As a result, Variable Delay Element 24 is variable in magnitudes equal to 1 delay step, which also implies that the step size is equal to 1 delay step. Therefore, when shifting right, delay is increased or increments by 1 delay step. Likewise, shifting left decreases or decrements the delay by 1 delay step. Fine Resolution Delay Element 22, on the other hand, has only 2 conditional delay path delays from its A input to Y output which are represented by either 1 or 1.5 delay steps. The delay of Fine Resolution Delay Element 22 is regulated by the positive edge triggered CLK input and the RL input. The CLKS output is derived from these inputs and is used to regulate Variable Delay Element 24 delay in unison with Fine Resolution Delay Element 22.

When configuring Fine Resolution Delay Element 22 serially with Variable Delay Element 24, the resulting delay line can be varied with delay steps equal to one-half the delay step of that given by a delay line consisting solely of Variable Delay Element 24. The magnitude of this delay step is the major contributor to the total jitter in a synchronized system. It is therefore advantageous to have lower jitter since this results in smaller system clock skew. This is better explained in the following examples:

Given: VDE (24) conditional delays: 1DS, 2DS, . . . 24DS, 25DS

FRDE (22) conditional delays: 1DS, 1.5DS where: DS=Delay Step

Example Locking Sequence with Variable Delay Element VDE (24): (Assume: 4DS<clock period<5DS)

|  | Period Sequence | VDE STATE | TOTAL DISPLAY |
|---|---|---|---|
|  | 1 | 1 DS | 1 DS |
|  | 2 | 2 DS | 2 DS |
|  | 3 | 3 DS | 3 DS |
|  | 4 | 4 DS | 4 DS |
| LOCK→ | 5 | 5 DS | 5 DS |
| ↕ | 6 | 4 DS | 4 DS |
| (JITTER) | 7 | 5 DS | 5 DS |
|  | 8 | 4 DS | 4 DS |

System is locked with jitter equal to 1DS.

Example Locking Sequence with Fine Resolution Delay Element FRDE 22 and Variable Delay Element VDE 24. (Assume: 4.5DS<clock period<5DS)

|  | Period Sequence | VDE State | FRDE State | Total Display |
|---|---|---|---|---|
|  | 1 | 1 DS | 1 DS | 2 DS |
|  | 2 | 1 DS | 1.5 DS | 2.5 DS |
|  | 3 | 2 DS | 1 DS | 3 DS |
|  | 4 | 2 DS | 1.5 DS | 3.5 DS |
|  | 5 | 3 DS | 1 DS | 4 DS |
|  | 6 | 3 DS | 1.5 DS | 4.5 DS |
| LOCK→ | 7 | 4 DS | 1 DS | 5 DS |
|  | 8 | 3 DS | 1.5 DS | 4.5 DS |
| (JITTER) | 9 | 4 DS | 1 DS | 5 DS |

System is locked with jitter equal to 0.5DS.

Therefore, selectively manipulating the MODE and CLKS outputs of Fine Resolution Delay Element 22 allows regulation of the A to Y delays in Variable Delay Element 24 to be adjusted in a manner such that the total delay through both elements is effectively varied in one-half steps. The implication is that phase jitter in a DPLL having a fine resolution delay element and a variable delay element can be reduced by a factor of 2 over a DPLL having only a variable delay element.

Referring again to FIG. 4, the QZ output of flip-flop 30 is connected to the right/left (RL) shift control input of the shift register 102 in FIG. 9. When the QZ output of flip-flop 30 is 1, then 1's are shifted rightwardly through the shift register 102 with each clock pulse, thereby increasing the delay provided by Variable Delay Element 24. On the other hand, when the QZ output is 0, then 0's are shifted leftwardly through shift register 102, thereby decreasing the delay provided by Variable Delay Element 24.

The operation of the phase detector 12 will now be described with reference to FIGS. 3, 4 and 13. At power up, the flip-flop 30 is cleared so that the QZ output is 1. Thus, the phase detector 12 initially causes Digital Delay Line 20 to begin increasing the amount of delay in the delay path 14. The delay will continue to increase until the QZ output changes to 0. However, the QZ output will be driven to a logic 0 only when a positive edge of the chip clock occurs within a specified time window after the occurrence of a positive edge of the system clock. This situation is indicated by chip clock 2 in FIG. 13. The width of the time window is determined by subtracting the sum of the propagation delay of AND gate 28 and the setup time of flip-flop 30 from the fixed delay amount of the fixed delay element 32, as shown in FIG. 4. The window width must be larger than the incremental delay amount of the Digital Delay Line 20, as will be explained in more detail below.

Figure 13:
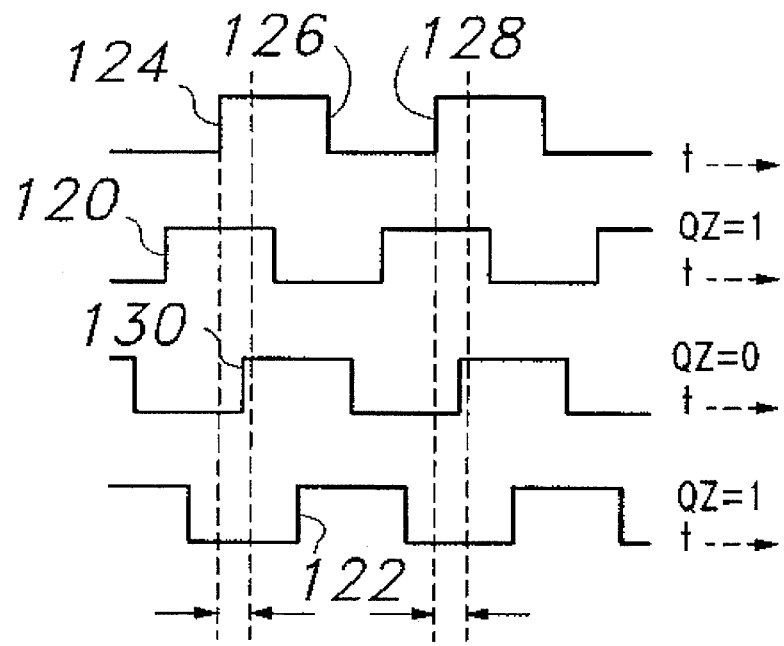
FIG. 13 is a timing diagram which illustrates the operation of the phase detector of FIG. 3.

Considering the case of chip clock 2 in FIGS. 4 and 13, the output of both NAND gates 24 and 26 is initially high, because both the system clock and chip clock 2 are initially low. When the system clock goes high, the output of NAND gate 24 goes low, setting the output of NAND gate 26 high. When chip clock 2 goes high, it propagates through the AND gate 28 to the D input of the flip-flop 30. As long as chip clock 2 falls within the window of FIG. 13, then a 1 will be clocked through the flip-flop 30 so that a 0 is applied to RL input of Fine Resolution Delay Element 22 and the right/left shift control RL input of shift register 102 of Variable Delay Element 24, thereby causing Digital Delay Line 20 to decrease the delay of delay path 14.

On the other hand, if a positive edge of the chip clock does not fall within the window of FIG. 13, then the phase detector 12 will output a 1 to the Fine Resolution Delay Element 22 and to shift register 102 Of Variable Delay Element 24, causing the delay to increase. Considering the case of chip clock 1 of FIG. 13, the outputs of NAND gates 24 and 26 are both initially high because both the system clock and chip clock 1 are initially low. When chip clock 1 goes high, the output of NAND gate 24 is held high due to the low output of NAND gate 26. Thus, when the system clock propagates through fixed delay element 32 to the flip-flop 30, it clocks a 0 through flip-flop 30 and causes the delay line to continue increasing the delay (because QZ is 1). The pulse edge 120 of chip clock 1 will eventually step into the window, at which time the Digital Delay Line 20 will decrease delay as discussed above with respect to chip clock 2. Pulse edge 120 of chip clock 1 can be guaranteed to step into the window but not completely through it by making the window width greater than the incremental delay amount of the Digital Delay Line 20.

Referring now to FIGS. 3, 4 and 13, the case of chip clock 3 will be described. It should be noted initially that the pulse edge 122 of chip clock 3 trails pulse edge 124 of the system clock by less than one-half cycle. The outputs of NAND gates 24 and 26 are initially high because both the system clock and chip clock 3 are initially low. When the system clock goes high, the output of NAND gate 24 goes low, latching the output of NAND gate 26 high and thereby enabling chip clock 3 to be applied to flip-flop 30 via AND gate 28. Note that edge 122 of chip clock 3 must trail edge 124 of the system clock by at least the minimum total delay of delay path 14. Therefore, the fixed delay at 32 can be made less than the minimum total delay of the delay path 14, so that the flip-flop 30 will be clocked by edge 124 of the system clock before edge 122 of chip clock 3 occurs. Thus, a 0 is clocked through flip-flop 30, causing Digital Delay Line 20 to increase delay.

Eventually, edge 122 of chip clock 3 will be time-shifted past edge 126 of the system clock so that edge 122 occurs immediately after edge 126. When the system clock goes low at edge 126, the output on NAND gate 24 is driven high, while the output on NAND gate 26 remains high because chip clock 3 is still low. When chip clock 3 goes high at edge 122, NAND gate 26 is driven low because both of its inputs are high. The low output of NAND gate 26 drives the output of AND gate 28 low, thus setting up a low level at the input of flip-flop 30. Therefore, when the next positive edge 128 of the system clock occurs, the input of flip-flop 30 is low, thus keeping the QZ output high and causing the Digital Delay Line 20 to continue increasing delay. Thereafter, the edge 122 of chip clock 3 will be eventually time-shifted past the edge 128 of the system clock. Because the incremental delay amount of Digital Delay Line 20 is less than the window width of FIG. 13, edge 122 will step into the window relative to edge 128 of the system clock. Thereafter, the PLL will decrease delay as discussed above with respect to chip clock 2.

Thus, both chip clock 1 and chip clock 3 will eventually be delayed enough for the respective positive edges 120 and 122 to step into the time window of FIG. 13, and the PLL circuit 10 will thereafter decrease delay as discussed above with respect to chip clock 2. Once the positive edge 122, 130 or 120 of chip clock 1, 2 or 3 step into the window, the phase detector 12 directs Digital Delay Line 20 to decrease delay until the edge steps leftwardly back out of the window, at which time phase detector 12 directs the Digital Delay Line 20 to increase delay. Thus, locking is achieved by causing the edge 130 to repeatedly step forwardly into and backwardly out of the window. In other words, at locking, phase detector 12 controls the shift register 102 so that the data therein is repetitively shifted one position leftwardly and then one position rightwardly and so on.

Thus, the PLL circuit 10 always increases the delay of the delay path 14 until a positive edge of the chip clock steps into the window, and thereafter decreases the delay until the positive edge steps out of the window, and thereafter alternately increases and decreases the delay to lock the positive edge of the chip clock to the positive edge of the system clock.

Regarding the design of the fixed delay element 32, assume for purposes of example that: the incremental delay amount of digital delay line 20 is 200 ps under minimum delay conditions of process, voltage and temperature and 650 ps under maximum delay conditions; and the sum of the propagation delay of AND gate 28 and the setup time of flip-flop 30 is 700 ps under minimum delay conditions of process, voltage and temperature and 2200 ps under maximum delay conditions. Using the foregoing example parameters, it is acceptable to provide a fixed delay at 32 of 1100 ps under minimum delay conditions of process, voltage and temperature and 3600 ps under maximum delay conditions. The fixed delay 32 can be conveniently implemented using a series of gate delays.

As noted above, the fixed delay at 32 must also be less than the minimum total delay of the delay path 14. This minimum total delay includes the minimum delay of Fine Resolution Delay Element 22 and Variable Delay Element 24 and the minimum delay of any other delaying elements in the delay path 14, such as the clock distribution circuit 18 of FIG. 2. Therefore, the minimum delay of delay path 14 is a function of design complexity, and depends on the fanout/frequency requirements of the particular system in which the PLL is to be used.

The digital PLL circuit 10 can easily be designed to operate at very high clock frequencies. Of course, shift register 102 has a maximum clocking frequency which cannot be exceeded. However, the system clock is easily divided down to a clocking frequency which is acceptable for shift register 102.

Figure 14:
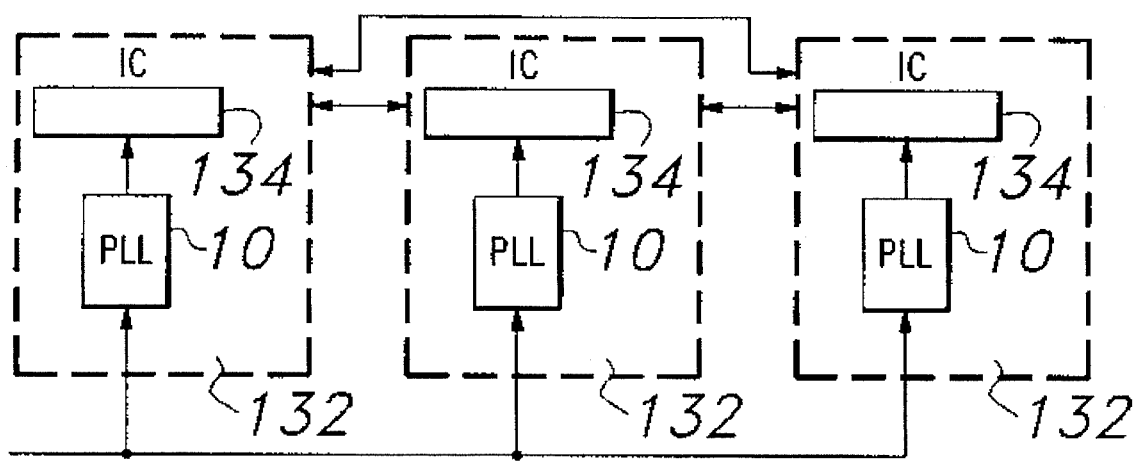
FIG. 14 is a block diagram showing the PLL circuit of FIG. 3 implemented in a multiple IC system.

FIG. 14 diagrammatically illustrates the use of PLL 10 in an electronic system having a plurality of interconnected ICs 132 which are all connected to a system clock. Each IC 132 is provided with a PLL 10 to synchronize the on-chip clock to the system clock. The on-chip clock is applied to the operational circuitry 134 of the IC 132.

While this invention has been described with reference to illustrative embodiments, this description is not to be construed in a limiting sense. Various modifications to the illustrative embodiments, as well as other embodiments of the invention will be apparent to persons skilled in the art upon reference to this description. It is therefore contemplated that the appended claims will cover any such modifications or embodiments as fall within the true scope of the invention.

What is claimed:

1. A digital phase locked loop circuit, comprising:

a phase detector for detecting a phase relationship between first and second clock signals, said phase detector having first and second input for said first and second clock signals to be applied thereto;

first means connected to said phase detector for providing delay adjustment of a first range;

second means responsive to said phase detector and to said first means for providing delay adjustment of a second range, a combination of said first and second means providing a precise delay adjustment; and said phase detector including a control circuit which, at a point in time when an edge of said second clock signal trails a corresponding edge of said first clock signal by less than one-half cycle, outputs a first control signal to said first and second means to cause the length of delay of said precise delay adjustment to increase until said edge of said second clock signal is eventually time-shifted past the next successive corresponding edge of said first clock signal.

2. A phase locked loop according to claim 1, wherein each of said first and second clock signals has a series of alternately rising and falling pulse edges.

3. A phase locked loop according to claim 1, wherein said first and second means constitute a digital delay line.

4. A phase locked loop according to claim 1, wherein said phase detector includes a third input for receiving a clear signal.

5. A phase locked loop according to claim 1, wherein said first means is a fine resolution delay element having a first input connected to an output of said phase detector, a second input connected to a third input of said phase detector and coupled to receive a control signal and at least a third input connected to said first input of said phase detector receiving said first clock signal.

6. A digital phase locked loop according to claim 5, wherein said second means is a variable delay element having a first input connected to a first output of said fine resolution delay element, a second input connected to a second output of said fine resolution delay element, a third input connected to said third input of said phase detector, a fourth input connected to said output of said phase detector and an output connected to said second input of said phase detector.

7. A digital delay line for inserting propagation delay into a signal path, comprising:

a first delay circuit for providing delay adjustment of a first range, said first delay circuit comprising at least one input receiving a clock signal, said first delay circuit comprising a synchronous divide by circuit; an element circuit; a halfstep switching logic circuit coupling said synchronous divide by circuit to said element circuit, each of said circuits having at least one input connected to an input of said first delay circuit and at least one output connected to an output of said first delay circuit; and a second delay circuit responsive to said first delay circuit, said second delay circuit providing delay adjustment of a second range.

8. A digital delay line according to claim 7, wherein said second delay circuit comprises:

a plurality of individual delay units, said delay units being cooperable and selectively insertable into the signal path;

each of said delay units including first and second delay elements, each said delay element having an input and an output, each said delay element providing a propagation delay between said input and said output thereof; and each of said delay units also including a pair of first and second switching elements which are switchable into open and closed positions, said first switching element being arranged between said pair of first and second delay elements for permitting selective connection of said output of said first delay element to said input of said second delay element, and said second switching element being arranged between said input of said second delay element and an output of a second delay element of an adjacent delay unit, for permitting selective connection of said second delay element input to an output of said second delay element of said adjacent delay unit.

9. A digital delay line according to claim 8, wherein said input of said first delay element of one of said delay units defines an input of said second delay circuit, and said output of said second delay element of said one delay unit defines an output of said second delay circuit, another of said delay units having a first delay element connected to said first delay element output of said one delay unit, said another of said delay units having a second delay element output thereof coupled to said second delay element input of said one delay unit by said second switching element of said one of said delay units.

10. A digital delay line according to claim 9, wherein additional said delay units are coupled to said another of said delay units in said chain-like configuration, each said additional delay unit being connected to the preceding adjacent delay unit in the same manner that said another of said delay units is connected to said one of said delay units.

11. A digital delay line according to claim 9, wherein said digital delay line includes a delay adjustment circuit connected to said switching elements for operating said switching elements to selectively insert the delay path sections into said signal path, said delay adjustment circuit being operative to always maintain each said pair of switching elements in respectively opposite operating positions, and said delay adjustment circuit being operative to sequentially select a plurality of said delay units and reverse the operating positions of the switching element pairs thereof substantially simultaneously with the sequential selection of the associated delay unit.

12. A digital delay line according to claim 11, wherein said delay elements are inverters, and wherein said delay adjustment circuit includes a serial bidirectional shift register having a plurality of bits, each of said bits being connected to both said switching elements of each respective switching element pair, one said switching element of each pair being closed when the associated bit is cleared and open when the associated bit is set, the other said switching element of each pair being closed when the associated bit is set and open when the associated bit is cleared, said shift register having a control input for controlling whether data is shifted leftwardly or rightwardly therein, said shift register having a first data input for data that is to be shifted rightwardly and having a second data input for data that is to be shifted leftwardly, one of said data inputs being held cleared, and the other of said data inputs being held set.

13. A digital delay line according to claim 7, wherein said synchronous divide by circuit comprises:

a first flip-flop, a first inverter, a second flip-flop, a first NAND gate, a second inverter, a third inverter, and a third flip flop;

a clock signal input of said first flip-flop connected to a clock signal input of said first delay circuit, an asynchronous clear signal input of said first flip-flop connected to a clear signal input of said first delay circuit, and an output connected to an input of said first inverter;

a clock signal input of said second flip-flop connected to said clock signal input of said first delay circuit, an asynchronous clear signal input of said second flip-flop connected to said clear signal input of said first delay circuit, a third input connected to the output of said first inverter and a fourth input connected to said output of said first flip-flop and to an input of said NAND gate, a first output, and a second output connected to a second input of said NAND gate;

an output of said NAND gate connected to an input of said second inverter, an output of said second inverter connected to an input of a third inverter and to a first input of said third flip-flop; and a second input of said third flip-flop connected to said input of said third inverter, a second input of said third flip-flop connected to said output of said third inverter, a clock signal input of third first flip-flop connected to a clock signal input of said first delay circuit, and an asynchronous clear signal input of said third flip-flop connected to a clear signal input of said first delay circuit.

14. A digital delay line according to claim 7, wherein said halfstep switching logic circuit comprises:

an exclusive NOR gate, a first flip-flop, a second flip-flop, a NOR gate, a first inverter, a second inverter, and first through fourth AND gates;

a clock signal input of said first and second flip-flop connected to a first output of said synchronous divide by circuit, a first input of said exclusive OR gate connected to an input of said first delay circuit, a second input of said exclusive OR gate connected to a second output of said synchronous divide by circuit;

an asynchronous clear signal input of said first and second flip-flops connected to a clear signal input of said first delay circuit; an output of said first flip-flop connected to a first output of said halfstep switching logic circuit for providing a first step control output signal and connected to an input of said first AND gate and an input of said first inverter, an output of said second flip-flop connected to a second output of said halfstep switching logic circuit for providing a second step control output signal and connected to a second input of said first AND gate and to a first input of said second AND gate;

an output of said first inverter connected to a second input of said second AND gate, an output of said second AND gate connected to a first input of said third AND gate, an output of said first AND gate connected to a first input of said fourth AND gate, an output of said second inverter connected to a second input of said fourth AND gate, an input of said second inverter and an a second input of said third AND gate connected to the input of said first delay circuit providing the second of said clock signals, an output of said third AND gate and an output of said fourth AND gate connected to first and second inputs, respectively, of said OR gate, a third input of said OR gate connected to said second output of said synchronous divide by circuit;

an output of said exclusive OR gate connected to a third input or said first flip-flop, an output of said OR gate connected to a third input of said second flip-flop, an output of said first flip-flop connected to a first output of said halfstep switching logic circuit for providing a first step control output signal, and an output of said second flip-flop connected to a second output of said halfstep switching logic circuit for providing a second step control output signal.

15. A digital delay line according to claim 7, wherein said element circuit comprises:

an inverter and twelve transistors, a data input of said first delay circuit connected to control gates of said first, second, third, fourth, fifth, sixth, seventh, and eighth transistors;

an output of said halfstep switching logic circuit, for providing a second step control output signal, connected to control gates of said ninth, tenth and eleventh transistors;

one of a source/drain said first transistor and one of a source/drain of said ninth transistors connected to VCC, the other of said source/drain of said first transistor connected to one of a source/drain of said second transistor the other of said source/drain of said second transistor connected to an input of said inverter and to one of a source/drain of said third transistor, to one of a source/drain of said fifth transistor and to one of a source/drain of said sixth transistor;

one of source/drain of said fourth transistor, the other of said source/drain of said fourth transistor, the other of said source/drain of said third transistor, one of a source/drain of said eleventh transistor and one of a source drain of said twelfth transistor connected to ground;

the other of the source/drain of said ninth transistor connected to the other of a source/drain of said fifth transistor, the other of a source/drain of said sixth transistor connected to one of a source/drain of said seventh transistor, the other of a sourer/drain of said seventh transistor connected to one of a source/drain of said eighth transistor, the other of a source/drain of said eighth transistor connected to one of a source/drain of said twelfth transistor, and an output of said inverter connected to an output of said element circuit for providing a data output.

16. A digital delay line according to claim 7, wherein said first delay circuit comprises two conditional delay paths from its input to output.

17. A digital delay line according to claim 16, wherein one of said two conditional delay paths is represented by one delay step and the other of said two conditional delay paths is represented by one and one-half delay steps.

18. A digital delay line according to claim 16, wherein said first range is one to one and one-half delay steps.

19. A digital delay line according to claim 7, wherein said second delay circuit comprises at least two conditional delay paths from its input to output.

20. A digital delay line according to claim 19, wherein each conditional delay path is represented by one delay step.

21. A digital delay line according to claim 19, wherein said second range varies in whole delay steps from two to the total number of conditional delay paths from its input to output.

22. A digital delay line according to claim 7, wherein said second delay circuit comprises at least twenty five conditional delay paths from its input to output.

23. A digital delay line according to claim 22, wherein each conditional delay path is represented by one delay step.

24. A digital delay line according to claim 22, wherein said second range varies in whole delay steps from two to the total number of conditional delay paths from its input to output.

25. A digital delay line according to claim 7, wherein configuring said first delay circuit serially with said second delay circuit provides said digital delay line with delay steps equal to one-half the delay step of that given by a delay line consisting solely of said second delay circuit.

26. A digital delay line according to claim 7, wherein configuring said first delay circuit serially with said second delay circuit facilitates delay adjustment in a manner such that the total delay through said first and second delay circuits is effectively varied in one-half delay steps.

27. A digital delay line according to claim 7, wherein said second delay circuit is configured as a ring oscillator by inserting an inverter between its input and output.

28. A digital delay line according to claim 7, wherein said second delay circuit can be configured as a ring oscillator or a delay line by inserting a pass gate and an inverter between its input and output and by respectively enabling or disabling the pass gate.

29. A digital delay line according to claim 7, wherein said delay adjustment of said first delay circuit and the delay adjustment of said second delay circuit can be adjusted in a manner such that the total delay through both circuits is effectively varied in one-half steps.

30. A digital delay line for inserting propagation delay into a signal path, comprising:

a first delay circuit for providing delay adjustment of a first range, said first delay circuit comprising a synchronous divide by circuit, a halfstep switching logic circuit, and an element circuit; a first input of said synchronous divide by circuit coupled to receive a clock signal, a second input of said synchronous divide by circuit coupled to receive a clear signal; a first input of said halfstep switching logic circuit connected to a first output of said synchronous divide by circuit and to a first output of said first delay circuit a second input connected to a second output of said synchronous divide by circuit and to a second output of said first delay circuit a third input coupled to receive said clear signal, and a first output connected to a third output of said first delay circuit a first input of said element circuit connected to a data input of said first delay circuit, a second input connected to a second output of said halfstep switching logic and to a fourth output of said first delay circuit and an output connected to a fifth output of said first delay circuit; and a second delay circuit responsive to said first delay circuit, said second delay circuit providing delay adjustment of a second range.

31. A digital delay line according to claim 30, wherein said first output of said first delay circuit receives a signal of a first division of a second clock signal, said second output of said first delay circuit receives a signal the a second division of said clock signal, said third output of said first delay circuit receives a first step control output signal, said fourth output of said first delay circuit receives a second step control output signal and a fifth output of said first delay circuit receives a data output signal.

32. A method for synchronizing a pair of periodic digital waveforms each including a series of alternately rising and falling pulse edges, comprising the steps of:

propagating a first periodic digital waveform through a delay path comprising a first delay circuit having stages for delay adjustment of a first range and a second delay circuit, responsive to said first delay circuit, having stages for delay adjustment of a second range, said delay path having an adjustable propagation delay;

obtaining a second periodic digital waveform at an output of the delay path; and increasing the propagation delay of the delay path even when an edge of the second waveform trails a corresponding edge of the first waveform by less than one-half cycle, including the step of continuing to increase the propagation delay of the delay path until said edge of the second waveform is eventually time-shifted past the next successive corresponding edge of the first waveform.

* * * * *